(12) United States Patent
Bressot et al.

(10) Patent No.: US 7,060,590 B2
(45) Date of Patent: Jun. 13, 2006

(54) LAYER TRANSFER METHOD

(75) Inventors: Séverine Bressot, La Riviere (FR);
Olivier Rayssac, Grenoble (FR);
Bernard Aspar, Rives (FR)

(73) Assignees: S.O.I. Tec Silicon on Insulator Technologies S.A., Bernin (FR);
Commissariat à l'Energie Atomique (CEA), Paris (FR)

(*) Notice: Subject to any disclaimer, the term of this patent is extended or adjusted under 35 U.S.C. 154(b) by 127 days.

(21) Appl. No.: 10/753,172

(22) Filed: Jan. 6, 2004

(65) Prior Publication Data

US 2004/0166649 A1 Aug. 26, 2004

Related U.S. Application Data

(60) Provisional application No. 60/472,437, filed on May 22, 2003.

(30) Foreign Application Priority Data

Jan. 24, 2003 (FR) .................................... 0300764

(51) Int. Cl.
*H01L 21/30* (2006.01)
*H01L 21/46* (2006.01)
(52) U.S. Cl. ...................... 438/455; 438/459; 438/464
(58) Field of Classification Search ................ 438/455, 438/459, 464
See application file for complete search history.

(56) References Cited

U.S. PATENT DOCUMENTS

| | | | | |
|---|---|---|---|---|
| 5,374,564 A | * | 12/1994 | Bruel ........................ | 438/455 |
| 5,391,257 A | | 2/1995 | Sullivan et al. ............. | 156/630 |
| 5,863,830 A | * | 1/1999 | Bruel et al. ................. | 438/478 |
| 6,177,359 B1 | | 1/2001 | Chen et al. .................. | 438/751 |
| 6,287,891 B1 | | 9/2001 | Sayyah ....................... | 438/106 |
| 6,316,333 B1 | * | 11/2001 | Bruel et al. ................. | 438/458 |
| 6,335,258 B1 | * | 1/2002 | Aspar et al. ................ | 438/406 |
| 6,376,332 B1 | | 4/2002 | Yanagita et al. ............ | 438/458 |
| 6,406,636 B1 | | 6/2002 | Vaganov ..................... | 216/2 |

(Continued)

FOREIGN PATENT DOCUMENTS

EP 0 106 566 B1 11/1989

(Continued)

OTHER PUBLICATIONS

S. Kodama et al., XP-00035156 "Variable Threshold AlGaAs/InGaAs Heterostructure Field-Effect Transistors with Paired Gated Gabricated Using the Wafer-Bonding Technique", vol. 241ga, p. 434-435 (1999).

*Primary Examiner*—George Fourson
*Assistant Examiner*—Fernando L. Toledo
(74) *Attorney, Agent, or Firm*—Winston & Strawn LLP (57) ABSTRACT

The invention relates to a method of removing a peripheral zone of adhesive while using a layer of adhesive in the process of assembling and transferring a layer of material from a source substrate to a support substrate. The method is remarkable in that it includes bonding the two substrates together by means of a curable adhesive so that an excess of adhesive is present. This assures proper bonding and provides a peripheral zone of adhesive outside of the joined substrates. Only that portion of adhesive is cured which is present in a connection zone between the substrates, and the peripheral zone of non-cured adhesive is removed prior to detaching the transferable layer. The invention is applicable to fabricating a composite substrate in the fields of electronics, opto-electronics, or optics.

26 Claims, 7 Drawing Sheets

U.S. PATENT DOCUMENTS

| | | | |
|---|---|---|---|
| 6,448,155 B1 | 9/2002 | Iwasaki et al. | 438/464 |
| 6,465,327 B1 * | 10/2002 | Aspar et al. | 438/458 |
| 6,534,380 B1 * | 3/2003 | Yamauchi et al. | 438/455 |
| 6,534,382 B1 * | 3/2003 | Sakaguchi et al. | 438/455 |
| 6,548,338 B1 | 4/2003 | Bernstein et al. | 438/210 |
| 6,562,648 B1 | 5/2003 | Wong et al. | 438/46 |
| 6,673,694 B1 | 1/2004 | Borenstein | 438/411 |
| 6,700,631 B1 | 3/2004 | Inoue et al. | 349/45 |
| 6,727,549 B1 | 4/2004 | Doyke | 257/347 |
| 6,767,763 B1 * | 7/2004 | Uchiyama | 438/116 |
| 6,809,009 B1 * | 10/2004 | Aspar et al. | 438/459 |
| 2001/0055854 A1 | 12/2001 | Nishida et al. | 438/455 |
| 2002/0042189 A1 | 4/2002 | Tanaka | 438/450 |
| 2002/0081822 A1 | 6/2002 | Yanagita et al. | 438/458 |
| 2002/0096717 A1 | 7/2002 | Chu et al. | 257/347 |
| 2002/0132451 A1 | 9/2002 | Akino et al. | 438/478 |
| 2003/0234075 A1 | 12/2003 | Aspar et al. | 156/344 |

FOREIGN PATENT DOCUMENTS

| | | |
|---|---|---|
| EP | 0 977 252 A1 | 2/2000 |
| EP | 1 059 663 A2 | 12/2000 |
| FR | 2 811 807 | 1/2002 |
| JP | 62229849 | 10/1987 |
| JP | 3106052 | 5/1991 |
| JP | 10320851 | 12/1998 |
| WO | WO 01/04933 A1 | 1/2001 |
| WO | WO 02/05344 A1 | 1/2002 |
| WO | WO 03/081664 A2 | 10/2003 |

* cited by examiner

FIG_13

FIG_14

FIG_15

FIG_16

FIG_17

LAYER TRANSFER METHOD

This application claims the benefit of U.S. provisional application No. 60/472,437 filed May 22, 2003, the entire content of which is expressly incorporated herein by reference thereto.

FIELD OF INVENTION

The method of the invention relates to transferring a layer of material from a source substrate onto a support substrate for the purpose of fabricating a composite substrate for use in applications in the fields of optics, opto-electronics, or electronics.

BACKGROUND OF THE INVENTION

Fabrication of a composite substrate for use in applications in the fields of optics, opto-electronics, or electronics often involves the need for transferring a layer of a material from a source substrate onto a support substrate. The methods for transferring a layer of material from a source substrate to a support substrate generally include applying the source substrate and support substrate against each other by molecular bonding, i.e., without using adhesive or an adhesive film. The transfer of the layer is possible provided that the mechanical retention of the layer on the source substrate is lower than the mechanical retention of the layer on the support substrate. This often is achieved by providing a weakened or detachment zone between the transferable layer and the source substrate, which zone allows detachment of the transferable layer without loss of the molecular bond between the transferable layer and the support substrate.

When adhesive is used for applying the source substrate to the support substrate, however, transferring the layer becomes more difficult since the exact volume of adhesive deposited on the substrate is difficult to control. Thus, the adhesive very often projects out beyond the respective side faces or sides of the substrates to form a flash so that the periphery of the area adjacent the detachment zone is covered at least partially and often completely by the adhesive. This occurs because the transferable layer is relatively thin. In addition, since the adhesive is cured to obtain the desired adhesive strength, the adhesive flash is also cured and hardened When this occurs, it becomes very difficult to properly detach and transfer the transferable layer. For example, the mechanical force to be applied to detach the layer becomes very high, and this may result in cleavage of one of the substrates in areas where not intended. In particular, cleavage or splitting of the support substrate may occur along fracture lines which no longer extend in a uniform plane, such as that provided by the detachment zone, but instead in a random and unpredictable manner. This causes additional polishing or other treatment steps before the surface of the transferable layer or source substrate can be used in further processing steps to form the optic, opto-electronic, or electronic component.

Thus, a need exists for an improved method for transferring a layer from a source substrate to a support substrate when adhesive is used for joining the substrates.

SUMMARY OF THE INVENTION

The invention relates to a method for transferring a transferable layer of material onto a support substrate by joining a source substrate that includes a transferable layer to a support substrate that is to receive the transferable layer by depositing an adhesive onto a surface of at least one of the substrates to create a connection zone between the substrates which connection zone includes the adhesive; treating the connection zone to increase adhesion properties of the adhesive; and detaching the transferable layer from the source substrate to provide the support substrate with the transferable layer and the connection zone.

Advantageously, the adhesive is deposited in an amount such that a peripheral zone of adhesive is formed at a periphery of at least one of the source substrate or the support substrate. This peripheral zone of adhesive may be created when the adhesive is deposited or when the connection zone is created. This assures that sufficient adhesive is present between the facing surfaces of the substrates so that a secure and complete bond can be obtained. The method includes removing the peripheral zone of adhesive from the periphery of the at least one substrate before adhering the substrates together.

When the adhesive is photocurable, at least one of the source or support substrates is transparent to light radiation to facilitate photocuring of the adhesive. In this embodiment, the treating step includes exposing the connection zone to light rays, and placing a mask between the light rays and the peripheral zone of adhesive to prevent photocuring of the adhesive in the peripheral zone. The mask substantially corresponds in size to the peripheral zone of adhesive so that it is not cured and can be easily removed. The adhesive also may be a thermoset material, and in this case, the treating step comprises heating the connection zone to set and cure the adhesive. A laser beam can be applied to locally heat the connection zone of adhesive for a sufficient amount of time to increase the adhesion properties of the adhesive.

In a preferred embodiment, the source substrate further includes a detachment zone between the transferable layer and source substrate to facilitate detachment of the transferable layer. This detachment zone can be a porous layer, a releasable bonding interface, or a stop layer that forms a barrier against chemical or mechanical attack. A convenient way to form the detachment zone is by implantation of atomic species to a predetermined depth beneath the surface of the source substrate. This can be achieved by the use of an ion beam implanter or a plasma implanter, using, for example, ions of hydrogen or rare gases. The detaching step generally comprises applying stress to the detachment zone in an amount sufficient to detach the transferable layer from the source substrate. The transferable layer and the source substrate each preferably comprise silicon, and further wherein the detachment zone includes a releasable bonding interface comprising silicon oxide.

BRIEF DESCRIPTION OF THE DRAWING FIGURES

Other characteristics and advantages of the invention become apparent from the following description of a preferred implementation of the invention. This description is made with reference to the accompanying drawings in which.

These figures are schematic diagrams in which the various layers and their thicknesses are not shown to scale and some have been deliberately enlarged for the purposes of clarification.

DETAILED DESCRIPTION OF THE PREFERRED EMBODIMENTS

A novel method has now been developed for transferring a layer of a material, particularly an optionally processed semiconductor material, from a first or "source" substrate onto a second or "support" substrate.

The method of the invention includes removing a peripheral zone of adhesive while using a layer of adhesive in the process of assembling and transferring a layer of material from a source substrate onto a support substrate for the purpose of fabricating a composite substrate for use in applications in the fields of optics, opto-electronics, or electronics.

The term "processed layer" designates a layer of material that has undergone some or all of the steps of a technical method for forming electronic components.

The source substrate may include a detachment zone, wherein an interface is created between a layer to be transferred and the remainder of the substrate. The detachment zone may be defined by implanting atomic species on the substrate, providing a porous zone on the substrate, or providing a substrate with two layers bonded to each other by means of a bonding interface with controlled bonding energy so that the bonding is not definitive, or any combination thereof. Also included in accordance with the method is providing any substrate having a zone that is weaker than the substrate proper.

The source substrate is brought into contact with a support substrate, thereafter a layer to be transferred is detached from the remainder of the source substrate along the detachment zone and is transferred to the support substrate. The transferable layer may be detached along the detachment zone by, for example, application of a stress, such as mechanical or electrical, or any other type of stress known in the art.

The mechanical stresses for example and not limitation are generally tension and/or bending and/or shear stresses. Such stresses can be applied, for example, by a pulling rig, a blade such as a guillotine, or by a plurality of blades introduced to the side of the stack of layers, at the detachment zone 13, or by a jet of fluid (liquid or gas) applied laterally at the detachment zone. Application of the mechanical stresses encourages the propagation of a crack at the detachment zone 13 and subsequent detachment of the layer to be transferred.

One advantage of the present invention is to overcome those disadvantages, and in particular to improve methods for layer transfer, and to prevent excess adhesive deposited at the bonding interface between a source substrate and a support substrate from masking the attack edge of the detachment zone and thereby making it more difficult to detach the transferable layer.

To that end, the method of the invention includes removing a peripheral zone of excess adhesive when adhesive is used in the process of assembling and transferring a layer of material from a source substrate onto a support substrate for the purpose of fabricating a composite substrate for use in applications in the fields of electronics, optics, or opto-electronics. As mentioned above, the source substrate may include a detachment zone interposed between the layer of material to be transferred and the remainder of the source substrate.

According to the invention, the method generally comprises the steps of: depositing a layer of adhesive on the free surface referred to as the "front face" of the transferable layer of material or on the "front" face of the support substrate or on both front faces; applying the source substrate and the support substrate against each other, wherein the front face of the support substrate is applied against the front face of the transferable layer; treating a connection zone of the adhesive layer, wherein the connection zone is defined by adhesive which extends facing the front face of the transferable layer, and the treating step increases its mechanical holding properties; detaching the transferable layer from the remainder of the source substrate along the detachment zone; and removing a peripheral zone of excess adhesive situated at the periphery of the connection zone, or any of the substrates, wherein the removing step is optionally performed on one or more occasions between the applying step and the reacting step, or between the reacting step and the detaching step, or after the removing step, and possibly if it is performed on a plurality of occasions, in part between steps the depositing step and the applying step.

In accordance with the invention, the adhesive includes a photocurable adhesive or alternatively a thermosetting adhesive. In which the adhesive is photocurable on being exposed to light radiation, Preferably if a photocurable adhesive is utilized, then at least one of the substrates i.e., the support substrate or the source substrate, is transparent to the light radiation, and preferably the reacting step comprises causing exclusively the connection zone of the adhesive layer to be cured from the rear face of the source substrate or from the rear face of the support substrate by being exposed to light rays through a mask for protecting from exposure the zone of the layer of adhesive that extends at the periphery of the connection zone.

Alternatively, if the adhesive is thermosetting, preferably the treating or reacting step causes only the connection zone of adhesive to be set by heating. For example by using localized heating means such as a laser beam, and then returning to a lower temperature.

The transferable layer preferably includes at least a portion of an electronic or an opto-electronic component.

The detachment zone on the source substrate may be defined by a number of methods including but not limited to creating a zone of weakness formed by for example, implanting atomic species or alternatively, formed by a porous layer. As another example, the detachment zone may be formed by a releasable bonding interface. Another alternative is the detachment zone is a stop layer comprising a barrier to chemical and/or mechanical attack.

The transferable layer and the remaining the source substrate are both made of silicon, and the releasable bonding interface is within or at the surface of a layer of silicon oxide.

In the remainder of the description, the various substrates described are considered to be in the shape of a disk or a cylinder since that is the shape most frequently encountered. However, that feature is not limiting and the substrates could have other shapes.

The invention relates to a method for transferring a transferable layer of material 41, derived from a source substrate 4, onto a support substrate 5. For example, such transferring of the transferable layer of material onto a support substrate may be for the fabrication of a composite substrate for applications in the fields of electronics, optics, and opto-electronics (see FIG. 4). The term "composite" means that the substrate has a plurality of layers.

In the remainder of the description and claims, the terms "source substrate" 4 and "support substrate" 5 should be interpreted as encompassing both a singular substrate of a given material and a stack of layers of materials which may be of different kinds.

Figure 1:
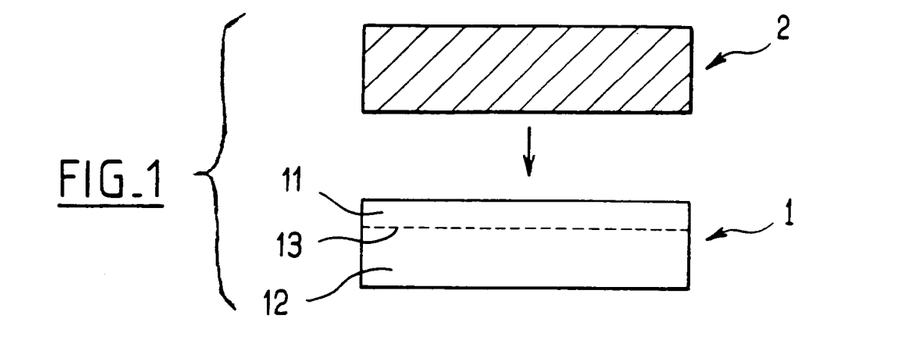
FIG. 1 illustrates a source substrate and a support substrate.
Figure 2:
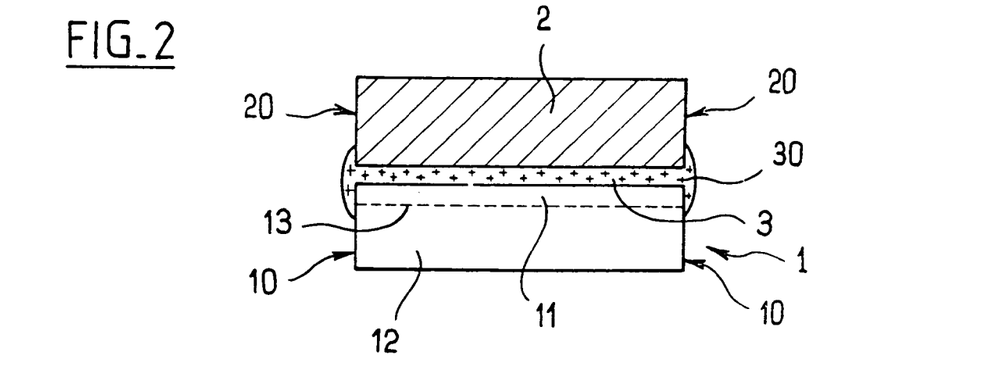
FIG. 2 illustrates adhering the source substrate to the support substrate.
Figure 3:
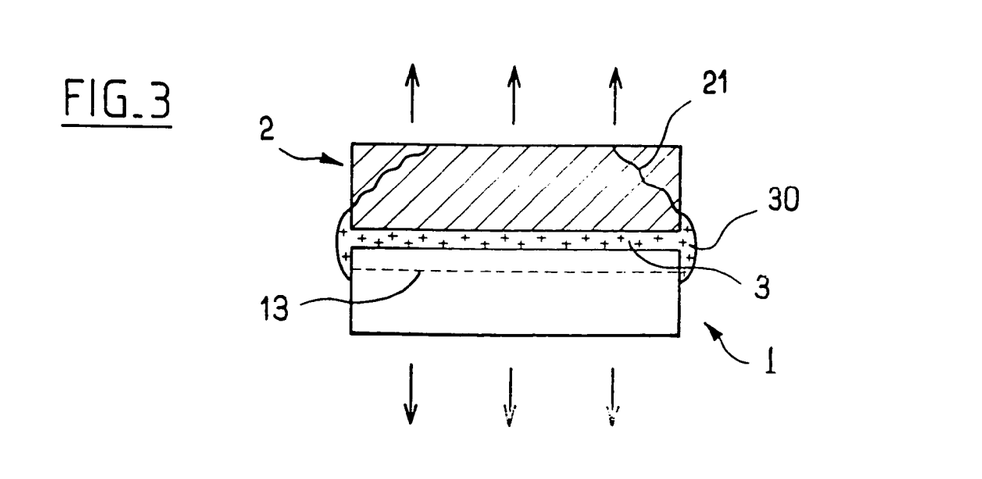
FIG. 3 illustrates excess adhesive spilling from the sides of the substrates of FIG. 2.
Figure 4:
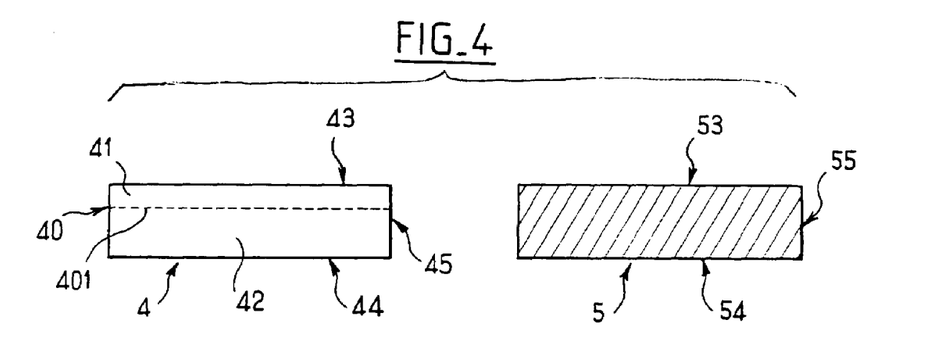
FIG. 4 illustrates a source substrate including a transferable layer and a support substrate to receive the transferable layer.

The source substrate 4 of the invention comprises a side face 45, which may be but not necessarily cylindrical, a front face 43 and a rear face 44, opposite to the front face. The source substrate further comprises an internal zone 40 termed the "detachment zone", which delineates the transferable layer 41 of material to be transferred, from the remainder 42 of the source substrate.

The layer 41 of material to be transferred is located beside the front face 43 of the source substrate. In accordance with the invention, the transferable layer may comprise all or part of an electronic or opto-electronic component, for example a component known as a microelectronic mechanical system (MEMS) or a micro-opto-electronic mechanical system (MOEMS).

The term "detachment zone" generally means a zone of the source substrate 4 along in which the two layers situated on either side thereof, i.e., the transferable layer 41 and the remainder of the source substrate 42, will subsequently detach more easily from each other, particularly on the application of a stress.

Figure 8:
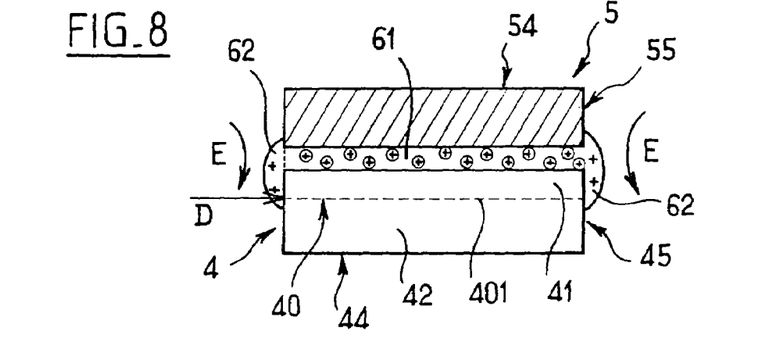
FIG. 8 illustrates removing the peripheral zone from the substrates of FIG. 7.

The detachment zone 40 generally comprises either a zone of weakness (FIG. 8 (401)) obtained by implanting atomic species or a porous zone. Alternatively, the detachment zone may comprise a releasable bonding interface 402, or a stop layer for mechanical or chemical attack as described herein. Also in accordance with the invention, the detachment zone may be the oxide layer of a silicon on insulator (SOI) type substrate.

When the zone of weakness 401 is obtained by implanting atomic species within the source substrate 4, the transferable layer 41 material and the remainder of the substrate 42 material may be the same material or different materials. For example, the transferable layer 41 may comprise one or more layers obtained by epitaxial growth. Alternatively, the transferable layer may comprise a buffer layer, likewise obtained by epitaxial growth. The skilled artisan is aware of how to obtain such layers.

The detachment zone defined by the implantation of atomic species is preferably carried out on the front face 43 of the layer 41 to be transferred, which is also the front face of the source substrate 4. The term "implanting atomic species" means any bombardment of atomic, molecular, or ionic species that is capable of introducing the species into a material at a certain depth with respect to the bombarded surface 43, with a concentration maximum of the species in the vicinity of the certain depth, wherein the depth is determined by the implantation energy of the species.

Alternatively, atomic species can be implanted in the source substrate 4 using an ion beam implanter or a plasma immersion implanter, or other methods that are generally known in the art.

Preferably, the implantation is accomplished by ionic bombardment and preferably the implanted ionic species is hydrogen. However, other ionic species can advantageously be used alone or in combination with hydrogen, such as for example rare gases (e.g., helium). By way of example, reference can be made to the literature concerning the method known under the trade name SMART-CUT®.

The zone of weakness 401 can also be comprised of a porous layer obtained, for example, during one of the steps of the method known under the trade name ELTRAN® filed by Canon, described in particular in U.S. Pat. No. 6,100,166, the content of which is expressly incorporated herein by reference thereto.

In this case, the source substrate 4 comprises a stack of layers comprising at least one layer of material 41 obtained by epitaxial growth on a porous layer 401, which layer rests on the remainder 42 of the source substrate.

When the detachment zone 40 comprises a "releasable" bonding interface 402, the interface is interposed between the transferable layer 41 and the remainder 42 of the source substrate comprising one or more layers. The term "releasable" as used herein means that bonding is not definitive so that the layer 41 can subsequently be released from the remainder 42. In this regard, reference can, for example, be made to published application WO02/084722 which describes a release method, and the content of which is expressly incorporated herein by reference thereto.

In a manner similar to that described above for the source substrate 4, the support substrate 5 has a side face 55, which may be cylindrical, a front face 53, and a rear face 54. The support substrate 5 acts to hold the assembly together mechanically.

Figure 5:
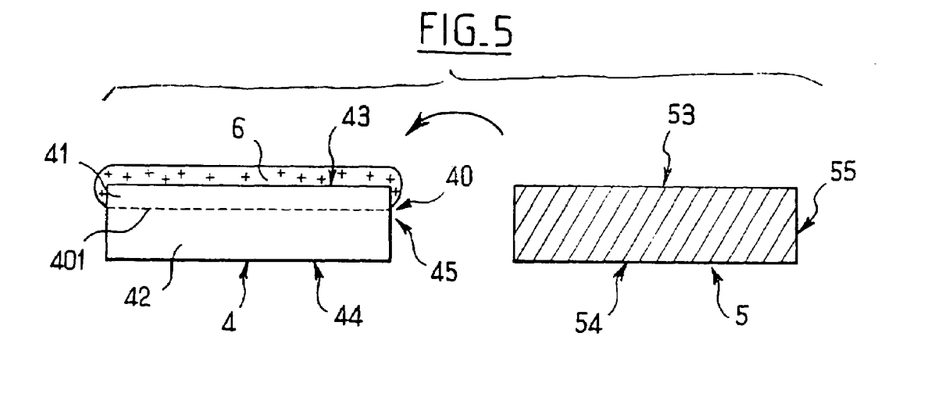
FIG. 5 illustrates adhesive applied to the source substrate for adhering the source substrate to the support substrate.

Referring to FIG. 5, a layer of adhesive 6 is deposited on the front face 43 of the source substrate 4, i.e. on the front face of the layer 41 of material to be transferred. This adhesive 6 could equally well be deposited on the front face 53 of the support substrate 5, or on the front faces 43 and 53 of both the source substrate and the support substrate.

Figure 6:
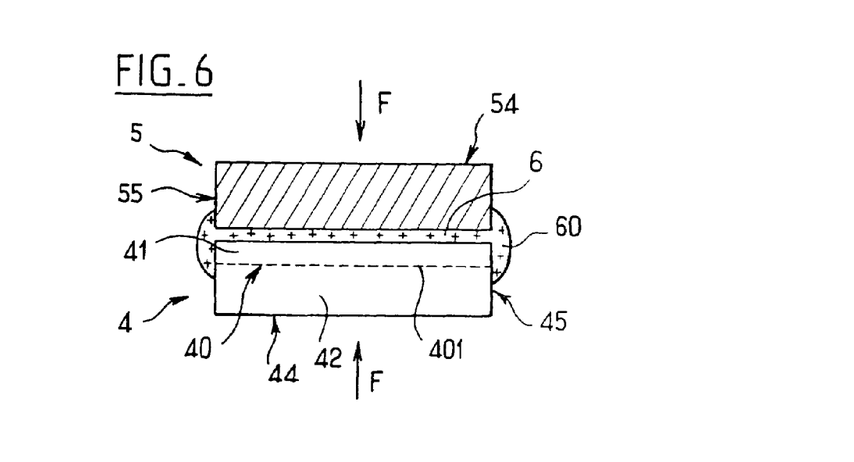
FIG. 6 illustrates the adhered source and support substrate.

Referring to FIG. 6, the source and support substrates 4 and 5 are then applied one against the other so that the adhesive 6 is interposed between the respective front faces 43 and 53 of the source substrate and the support substrate, and these two substrates 4 and 5 are pressed one against the other (arrow F). The excess 60 of adhesive 6 spills out onto the side faces 45 and 55 of the source substrate 4 and the support substrate 5.

Figure 7:
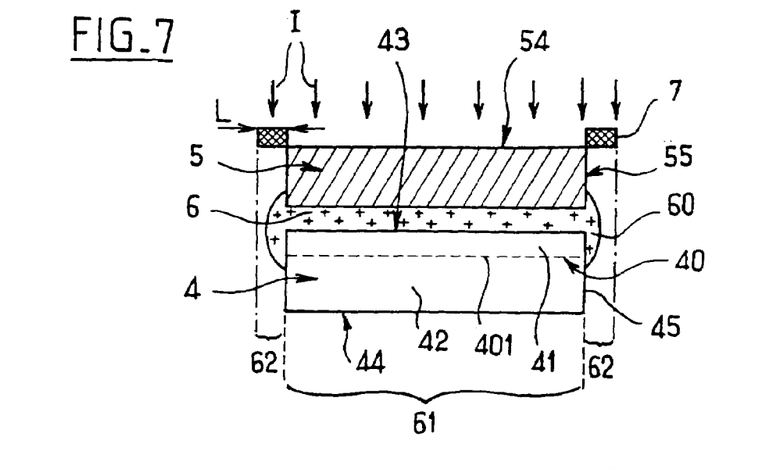
FIG. 7 illustrates the adhered source and support substrate including connection zone and peripheral zone, and mask for protecting peripheral zone.

As shown in FIG. 7, treatment is subsequently performed comprising the step of causing a reaction to take place solely in zone 61 of the adhesive 6, referred to as the "connection zone." The connection zone extends facing the front face 43 of the layer of material to be transferred, so that in the zone the mechanical holding properties of the adhesive increase, i.e. the adhesive holds mechanically more strongly.

The adhesive 6 is preferably a curable adhesive and the above-mentioned treatment comprises curing it the curable adhesive.

In one embodiment of the invention, the adhesive 6 is a photocurable adhesive, i.e. an adhesive suitable for curing and setting under the action of light radiation, for example ultraviolet (UV) radiation. By way of example, mention can be made of a UV adhesive such as the adhesive known under the name VITRALIT 6127N and sold by the supplier ELECO PRODUITS, or a so-called "negative" resin.

Curing is performed by exposure (arrows I) through a mask 7, preferably having an annular shape, and having an inside diameter corresponding at most to the diameter of the transferable layer 41. This inside diameter could equally be slightly smaller than the diameter of the layer 41. The mask 7 protects from exposure the zone 62 of the layer of adhesive 6 extending to the outer periphery of the transferable layer 41.

The mask 7 is placed substantially in the same plane as the rear face 54 of the support substrate 5. The width L of the section of the annular mask 7 should be not less than and is preferably greater than the thickness or width of the excess adhesive 60 on the side faces 45 and 55 of the two substrates.

The shape of the mask 7 is naturally adapted to the shape of the outer outline of the layer 41 to be transferred.

Exposure takes place from the rear face 54 of the support substrate 5, the substrate being transparent to light radiation of the kind suitable for curing the adhesive, and in particular ultraviolet radiation if the adhesive is UV-curable.

After exposure, only the connection zone 61 of the layer of adhesive 6 that extends facing the front face 43 of the transferable layer 41 is cured and set. Alternatively, the exposure could equally well be performed through the source substrate 4, providing that the source substrate is transparent to rays suitable for causing the adhesive 6 to react, in which case the mask 7 should be placed substantially in the same plane as the rear face 44 of the source substrate.

Thereafter, the mask 7 is withdrawn and the non-cured peripheral annular zone 62 of the adhesive 6 is removed (arrows E in FIG. 8), e.g. by wiping the side faces 45 and 55 of the stack of substrates 4 and 5 using a cloth or by chemical cleaning using a suitable solvent that specifically dissolves the non-cured adhesive or any other known method in the art.

The transferable layer 41 is detached from the remainder 42 of the source substrate 4 along the detachment zone or zone of weakness 401. Such detachment may be achieved by for example applying stress of mechanical origin (see FIG. 8, arrow D, and FIG. 9). This is possible because there is no longer adhesive at the intersection between the detachment zone or zone of weakness 401 and the side face 45 of the source substrate 4.

For purpose of illustration and not limitation, the stress of mechanical origin may be traction stress and/or bending stress and/or shear stress and it may be applied, for example, by means of a pulling rig, or by a blade, such as a guillotine, inserted from the side face 45 of the source substrate 4 into the zone of weakness 401, or indeed by a jet of fluid (liquid or gas) applied laterally against the zone 401.

By way of example, reference can be made to U.S. Pat. No. 6,100,166 and published application WO01/04933, the content of which is expressly incorporated herein by reference thereto. These publications describe methods of detaching two layers one from the other, respectively by means of a jet of gas such as air and by means of a jet of liquid such as water.

Detachment could also be performed by other methods which can be used singly or in combination with one another or with mechanical detachment, namely applying stresses of electrical origin (applying an electrostatic or an electromagnetic field); or applying heat energy (radiation, convection, conduction, increasing pressure in microcavities), etc.

Figure 9:
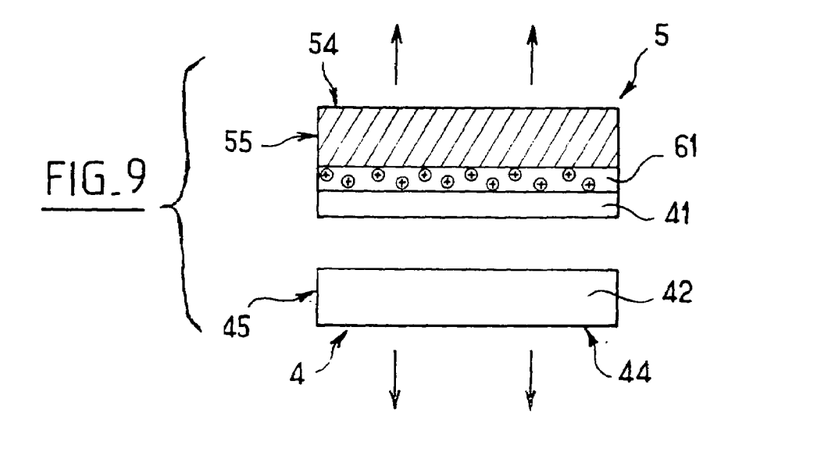
FIG. 9 illustrates detaching the transferable layer from the source substrate to the support substrate.
Figure 10:
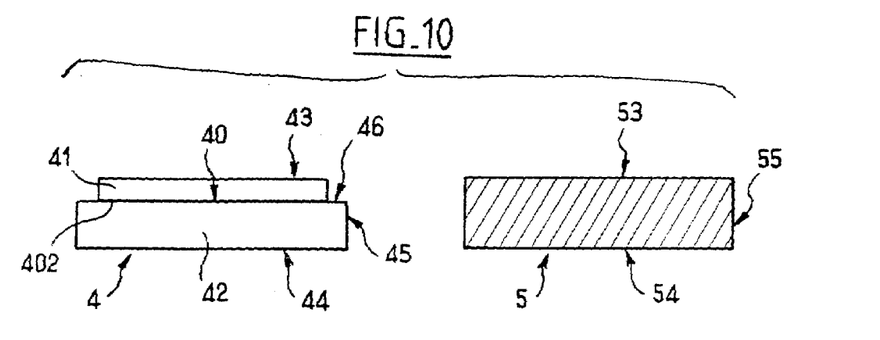
FIG. 10 illustrates the source substrate and support substrate of another embodiment, wherein a peripheral zone of adhesive is formed on the transferable layer.
Figure 11:
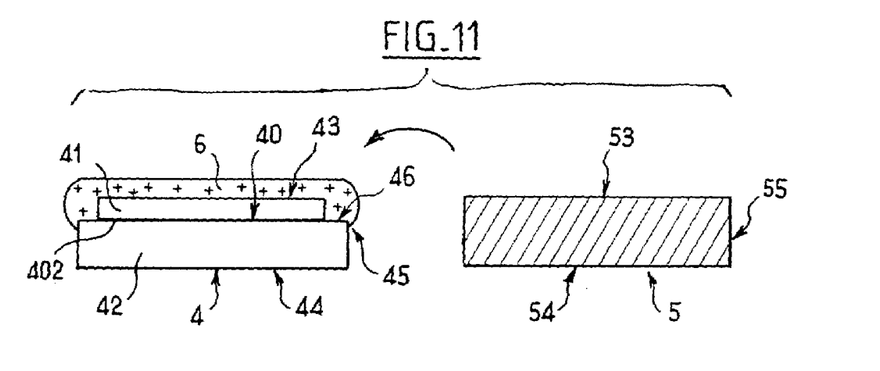
FIG. 11 illustrates applying adhesive to the source substrate of FIG. 10.

It should also be observed that the step of removing the peripheral zone 62 of the non-cured adhesive could equally well be performed as a single step or in a plurality of steps after the substrates 4 and 5 have been applied one against the other and prior to the step of exposing the adhesive through the mask 7, or on the contrary after the detachment step of FIG. 9.

In this last case, detachment is possible since even if adhesive remains at the intersection between the detachment zone or zone of weakness 401 and the side face 45 of the source substrate, this adhesive 62 is not cured and it therefore does not impede access of a guillotine blade, for example, and it does not perform any mechanical holding function.

It should be observed that it would also be possible to remove a portion of the adhesive 6, e.g. a portion of adhesive which has flowed over the sides of the substrate, prior to applying the substrates 4 and 5 against each other.

The material comprising all or part of the source substrate 4 can be any material, in particular a semi-conductor material, suitable for use in applications in the optical, electronic, and opto-electronic fields. Purely by way of illustrative example, mention can be made of silicon; silicon germanium, germanium; silicon carbide (SiC), and III-V materials, i.e., compounds in which one of the elements comes from column IIIa of the periodic table of elements, and the other comes from column Va, e.g., gallium arsenide (AsGa) or indium phosphide (InP).

As mentioned above, exposure may takes place through the source substrate 4. If so, then the source substrate must be transparent to the rays used. For example, when using ultraviolet radiation, the source substrate may comprise for example, glass, fused silica, quartz, or a plastics material.

The support substrate 5 provides mechanical support. When exposure is performed through the support substrate, it is made of a material that is transparent to the rays.

Referring to FIGS. 10 to 15 another embodiment of the method of the invention is includes a "releasable" SOI substrate, the transferable layer 41 and the remainder 42 of the source substrate are made of silicon and the detachment zone 40 is a releasable bonding interface comprising a layer 402 of silicon oxide.

FIGS. 10 to 15 shows an embodiment of the above-described method presenting certain steps that are similar to those described above with reference to FIGS. 4 to 9. Elements that are identical between both implementations are given the same numerical references. Only the differences between the two methods are described below.

In the example shown in FIGS. 10 to 15, it is assumed that during bonding of the transferable layer 41 on the source layer 42, the bonding between the two layers was not strong enough at the periphery, and as a result a substantially annular peripheral ring zone 46 was formed on the source layer 42. The transferable layer 41 thus presents a diameter that is smaller than the diameter of the layer 42. In addition, the detachment zone 40 is a releasable bonding interface given reference 402.

Figure 12:
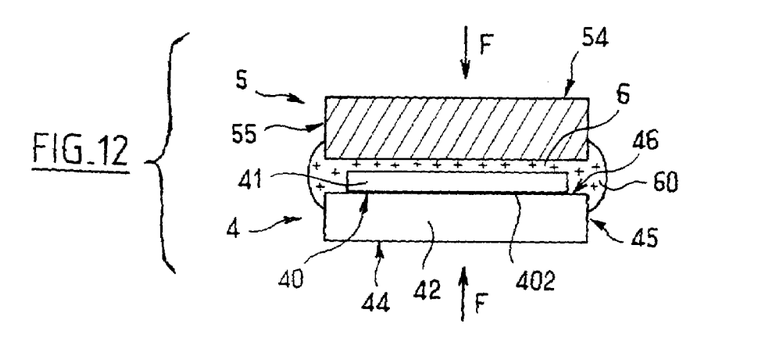
FIG. 12 illustrates adhering the source substrate and support substrate of FIG. 11.

During the step of depositing the layer of adhesive 6 or the step of applying the support substrate 5 against the SOI type substrate 4, the excess adhesive 60 flows not only towards the side faces 45 and 55 of the substrates 4 and 5, but also over the peripheral zone ring 46 (FIG. 12).

Figure 13:
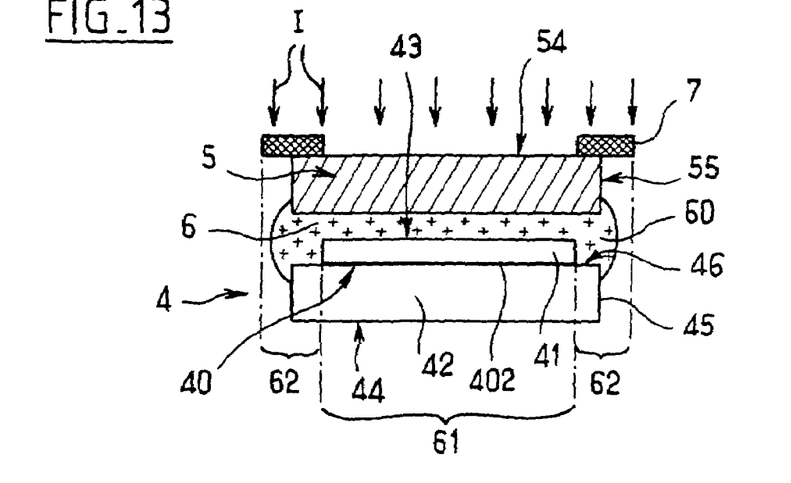
FIG. 13 illustrates the adhered source and support substrate of FIG. 12 including connection zone and peripheral zone, and mask for protecting peripheral zone.

During the exposure step shown in FIG. 13, it should be observed that the inside diameter of the mask 7 is less than or equal to the diameter of the layer 41 since it is necessary to avoid exposing the adhesive occupying the peripheral ring 46 (zone 62).

Figure 14:
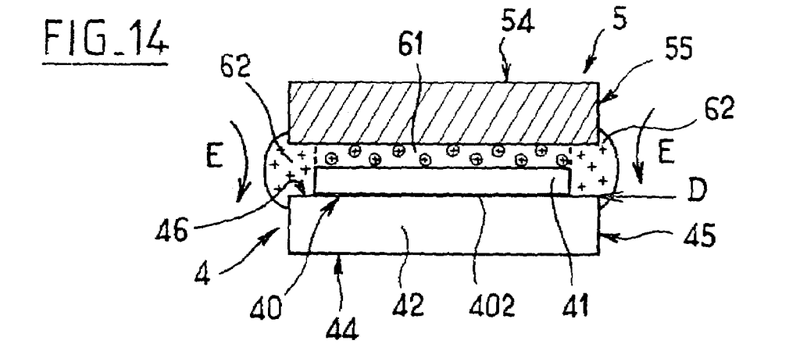
FIG. 14 illustrates removing the peripheral zone from the substrates of FIG. 13.
Figure 15:
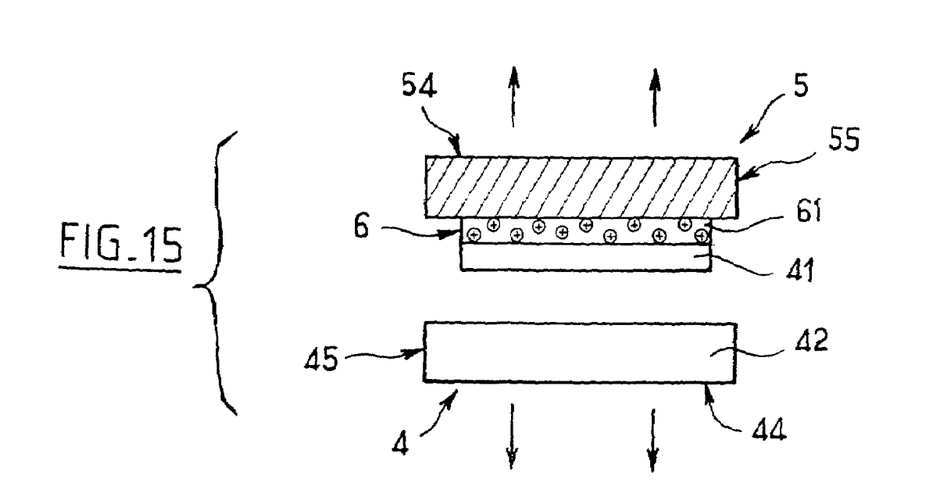
FIG. 15 illustrates detaching the transferable layer from the source substrate to the support substrate.

After exposure, and after the peripheral zone 62 of non-cured adhesive has been removed (see arrow E in FIG. 14), it can be seen that the connection zone 61 of cured adhesive extends solely between the front face 43 of the layer 41 and the support 5, thus making it possible to realize the subsequent operation of implementing detachment at the oxide layer 402 (see arrow D in FIG. 14, and FIG. 15).

As for the method described above with reference to FIGS. 4 to 9, it is possible to remove the zone 62 of non-cured adhesive prior to exposure, or on the contrary after the detachment step of FIG. 15.

In another embodiment of the method, the rear layer 42 is withdrawn by lapping and/or by chemical attack. The oxide layer 402 then acts as a stop layer for the lapping and/or as a selective barrier for chemical or chemical-mechanical attack. By way of example, tetramethyl hydroxylamine (TMAH) can be used for selectively etching a silicon layer 42 and not a silicon oxide layer 402.

In general, the method of the invention can be applied to a source substrate 4 presenting an intermediate layer having a surface or a volume that acts as a releasable bonding interface or as a stop barrier against chemical and/or mechanical attack.

In another aspect of the invention, the adhesive 6 is a thermosetting adhesive, such as but not limited to a wax or an epoxy adhesive.

Under such circumstances, the steps of the method described with reference to FIGS. 4 to 6 are identical, and only the subsequent steps differ, and are shown in FIGS. 16 to 19.

Figure 16:
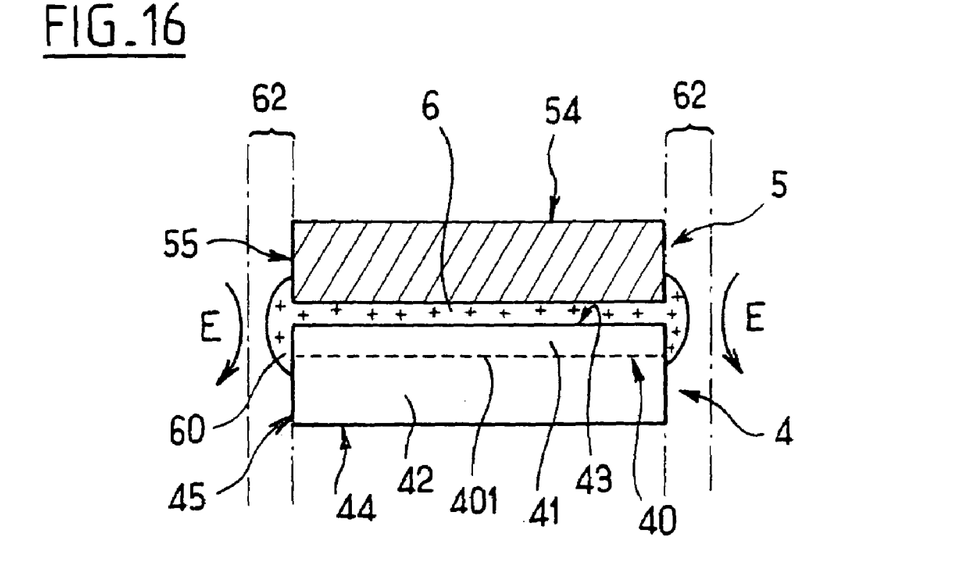
FIG. 16 illustrates the peripheral zone of excess adhesive removed from substrates.
Figure 17:
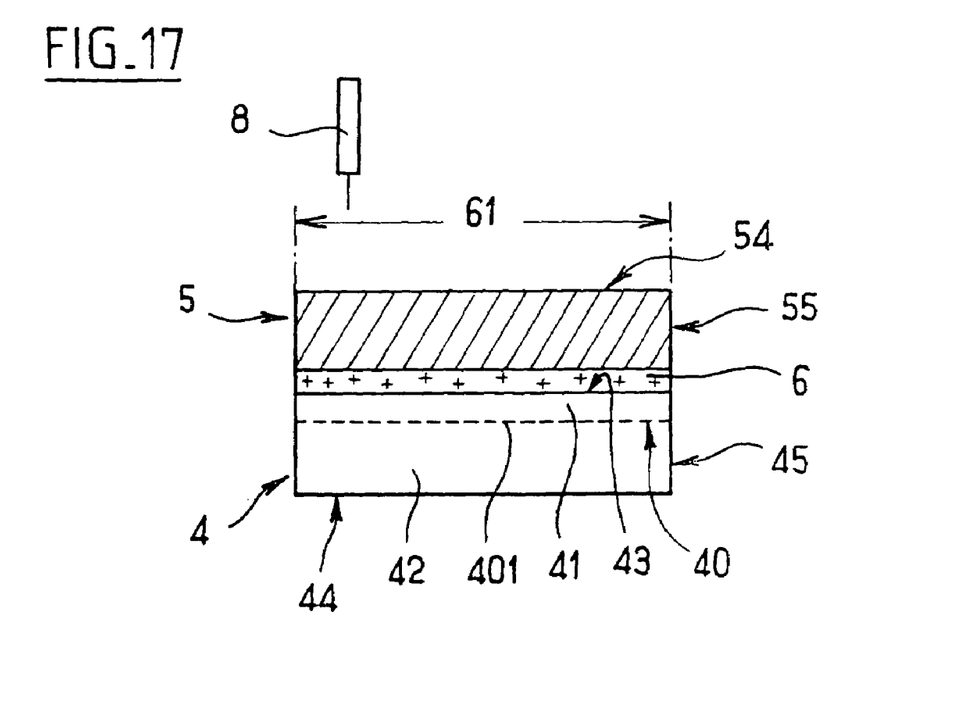
FIG. 17 illustrates curing the adhesive with a laser beam.
Figure 18:
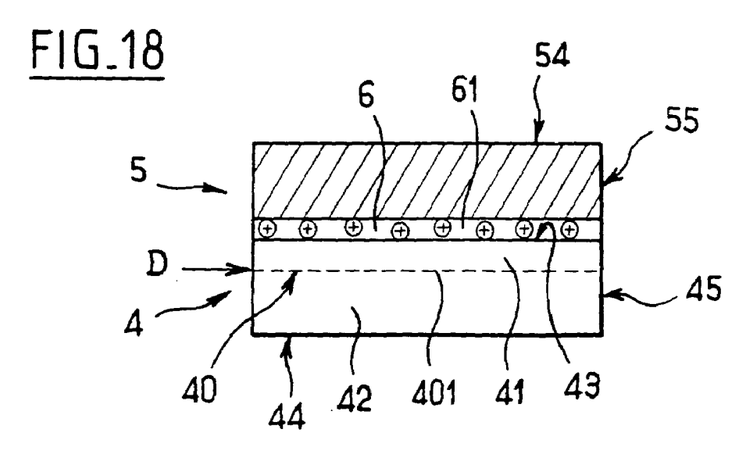
FIG. 18 illustrates the cured adhesive having no effect on the detachment zone.
Figure 19:
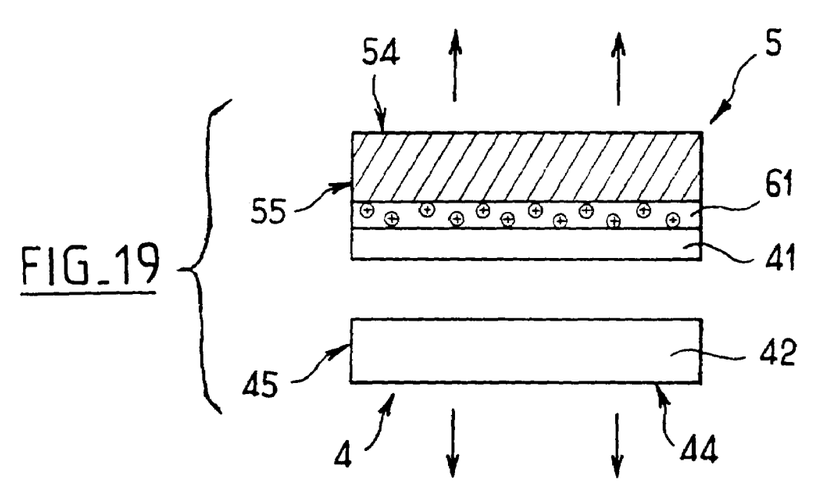
FIG. 19 illustrates detaching the transferable layer.

By way of example, excess adhesive 60 is initially wiped off (FIG. 16). Nevertheless, this step could also be performed subsequently.

The adhesive 6 is cured by localized heating of the zone 61 of the layer of adhesive 6 that is situated facing the front face 43 of the layer 41 to be transferred, followed by cooling (return to ambient temperature).

Localized heating can be performed, for example, by scanning using a laser beam 8 from the rear face 54 of the support substrate 5 (see FIGS. 17 and 18) or from the rear face 44 of the source substrate 4, the temperature at which heating is performed (about 200° C. to 300° C.) having no effect on the zone of weakness 401.

The localized heating may also be implemented by heating the entire stack of layers while simultaneously cooling its sides so that their temperature does not rise enough to enable the zone 62 of the layer of adhesive to cure. The heating can also be performed using a lamp.

Detachment of the transferable layer (see FIG. 18) is performed as described for the preceding methods.

What is claimed is:

1. A method for transferring a transferable layer of material onto a support substrate, the method comprising:
   joining a source substrate that includes a transferable layer to a support substrate that is to receive the transferable layer by depositing an adhesive onto a surface of at least one of the substrates to create a connection zone between the substrates which connection zone includes the adhesive;
   treating the connection zone to increase adhesion properties of the adhesive; and
   detaching the transferable layer from the source substrate to provide the support substrate with the transferable layer and the connection zone, and
   removing at least a portion of adhesive located beyond the periphery of the transferable layer, the support substrate or the connection zone formed between the transferable layer and support substrate prior to detaching the transferable layer.

2. The method of claim 1, wherein the adhesive is deposited in an amount such that a peripheral zone of adhesive is formed at the periphery of at least one of the source substrate or the support substrate and a portion or all of this peripheral zone is removed.

3. The method of claim 2, wherein the peripheral zone of adhesive is created when the adhesive is deposited.

4. The method of claim 2, wherein the peripheral zone of adhesive is created when the connection zone is created.

5. A method for transferring a transferable layer of material onto a support substrate, the method comprising:
   joining a source substrate that includes a transferable layer to a support substrate that is to receive the transferable layer by depositing an adhesive onto a surface of at least one of the substrates to create a connection zone between the substrates which connection zone includes the adhesive;
   treating the connection zone to increase adhesion properties of the adhesive; and
   detaching the transferable layer from the source substrate to provide the support substrate with the transferable layer and the connection zone,
   wherein the method further includes removing the peripheral zone of adhesive from the periphery of the at least one substrate before adhering the substrates together.

6. The method of claim 1, wherein the adhesive is photocurable, and further wherein at least one of the source or support substrates is transparent to light radiation to facilitate photocuring of the adhesive.

7. The method of claim 6, wherein the treating step includes exposing the connection zone to light rays, and placing a mask between the light rays and the peripheral zone of adhesive to prevent photocuring of the adhesive in the peripheral zone to facilitate removal of a portion or all of the peripheral zone.

8. The method of claim 7, wherein the mask substantially corresponds in size to the peripheral zone of adhesive and all or a portion of the adhesive is removed from the periphery of the at least one substrate after adhering the substrates together.

9. The method of claim 1, wherein the adhesive comprises a thermoset material, and further wherein the treating step comprises heating the connection zone to set and cure the adhesive.

10. The method of claim 9, wherein the heating step comprises applying a laser beam to locally heat the connection zone of adhesive for a sufficient amount of time to increase the adhesion properties of the adhesive but without increasing the adhesive properties of the adhesive located beyond the periphery of the transferable layer, the support substrate or the connection zone formed between the transferable layer and support substrate.

11. The method of claim 1, wherein the source substrate further includes a detachment zone between the transferable layer and source substrate.

12. The method of claim 11, wherein the detachment zone is a porous layer, a releasable bonding interface, or a stop layer that forms a barrier against chemical or mechanical attack.

13. The method of claim 11, wherein the detachment zone is formed by implantation of atomic species to a predetermined depth beneath the surface of the source substrate.

14. The method of claim 13, wherein the implantation of atomic species is performed with an ion beam implanter or a plasma implanter, and further wherein the atomic species is hydrogen ions.

15. The method of claim 11, wherein the detaching step comprises applying stress to the detachment zone in an amount sufficient to detach the transferable layer from the source substrate.

16. The method of claim 11, wherein the transferable layer and the source substrate each comprise silicon, and further wherein the detachment zone includes a releasable bonding interface comprising silicon oxide.

17. A method for transferring a transferable layer of material onto a support substrate, the method comprising:
joining a source substrate that includes a transferable layer to a support substrate that is to receive the transferable layer by depositing an adhesive onto a surface of at least one of the substrates to create a connection zone between the substrates which connection zone includes the adhesive;
curing the adhesive in the connection zone to increase adhesion properties of the adhesive; and
detaching the transferable layer from the source substrate to provide the support substrate with the transferable layer and the connection zone,
wherein the adhesive is deposited in an amount such that a peripheral zone of adhesive is formed at a periphery of at least one of the source substrate or the support substrate, and which further comprises removing the peripheral zone of adhesive prior to detaching the transferable layer.

18. The method of claim 17, wherein the connection zone includes an amount of adhesive that overflows onto a side of at least one of the substrates.

19. The method of claim 17, wherein the adhesive is photocurable, at least one of the source or support substrates is transparent to light radiation to facilitate photocuring of the adhesive, the treating step includes exposing the connection zone to light rays, and placing a mask between the light rays and the peripheral zone of adhesive to prevent photocuring of the adhesive in the peripheral zone.

20. The method according to claim 18, wherein the mask is withdrawn and the peripheral zone of adhesive is removed by chemical cleaning.

21. The method of claim 1, wherein the transferable layer comprises at least a portion of an electronic or an optoelectronic component.

22. The method of claim 1 wherein the connection zone is treated in a manner to increase the adhesion properties of the adhesive but without increasing the adhesive properties of the adhesive located beyond the periphery of the transferable layer, the support substrate or the connection zone formed between the transferable layer and support substrate.

23. A method for transferring a transferable layer of material onto a support substrate, the method comprising:
joining a source substrate that includes a transferable layer to a support substrate that is to receive the transferable layer by depositing an adhesive onto a surface of at least one of the substrates to create a connection zone between the substrates which connection zone includes the adhesive;
treating the connection zone to increase adhesion properties of the adhesive;
detaching the transferable layer from the source substrate to provide the support substrate with the transferable layer and the connection zone, and
removing at least a portion of adhesive located beyond the periphery of the transferable layer, the support substrate or the connection zone formed between the transferable layer and support substrate;
wherein all or a portion of the adhesive located beyond the periphery of the transferable layer, the support substrate or the connection zone formed between the transferable layer and support substrate is removed prior to treating the connection zone.

24. The method of claim 1 wherein all or a portion of the adhesive located beyond the periphery of the transferable layer, the support substrate or the connection zone formed between the transferable layer and support substrate is removed after joining the substrates together.

25. A method for transferring a transferable layer of material onto a support substrate, the method comprising:
joining a source substrate that includes a transferable layer to a support substrate that is to receive the transferable layer by depositing an adhesive onto a surface of at least one of the substrates to create a connection zone between the substrates which connection zone includes the adhesive;
treating the connection zone to increase adhesion properties of the adhesive;
detaching the transferable layer from the source substrate to provide the support substrate with the transferable layer and the connection zone, and
removing at least a portion of adhesive located beyond the periphery of the transferable layer, the support substrate or the connection zone formed between the transferable layer and support substrate;
wherein the adhesive is deposited in an amount such that a peripheral zone of adhesive is formed at the periphery of at least one of the source substrate or the support substrate and all or a portion of the peripheral zone is removed prior to joining the source substrate and transferable layer.

26. A method for transferring a transferable layer of material onto a support substrate, the method comprising:
joining a source substrate that includes a transferable layer to a support substrate that is to receive the transferable layer by depositing an adhesive that comprises a thermoset material onto a surface of at least one of the substrates to create a connection zone between the substrates which connection zone includes the adhesive;
heating the connection zone to set and cure the adhesive;
detaching the transferable layer from the source substrate to provide the support substrate with the transferable layer and the connection zone, and
removing at least a portion of adhesive located beyond the periphery of the transferable layer, the support substrate or the connection zone formed between the transferable layer and support substrate;
wherein all or a portion of the adhesive located beyond the connection zone formed between the transferable layer and support substrate is removed after joining the substrates together but prior to detaching the transferable layer.

* * * * *

UNITED STATES PATENT AND TRADEMARK OFFICE
CERTIFICATE OF CORRECTION

PATENT NO. : 7,060,590 B2
APPLICATION NO. : 10/753172
DATED : June 13, 2006
INVENTOR(S) : Bressot et al.

It is certified that error appears in the above-identified patent and that said Letters Patent is hereby corrected as shown below:

Title Page:
Item [56] References Cited, OTHER PUBLICATIONS, S. Kodama et al. reference, change "XP-00035156 to -- XP-000935156 --; change "Gated Gabricated" to -- Gates Fabricated --; and delete "vol. 241ga" and inserted -- Extended Abstracts of the 1999 International Conference on Solid State Devices and Materials, Tokyo --.

Signed and Sealed this

Twenty-ninth Day of August, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,060,590 B2 |
| APPLICATION NO. | : 10/753172 |
| DATED | : June 13, 2006 |
| INVENTOR(S) | : Bressot et al. |

Page 1 of 1

It is certified that error appears in the above-identified patent and that said Letters Patent is hereby corrected as shown below:

<u>Title Page</u>:
Item [56] References Cited, OTHER PUBLICATIONS, S. Kodama et al. reference, change "XP-00035156" to -- XP-000935156 --; change "Gated Gabricated" to -- Gates Fabricated --; and delete "vol. 241ga" and insert -- Extended Abstracts of the 1999 International Conference on Solid State Devices and Materials, Tokyo --.

Signed and Sealed this

Fifth Day of September, 2006

JON W. DUDAS
*Director of the United States Patent and Trademark Office*